United States Patent [19]

Susak et al.

[11] Patent Number: 5,012,139
[45] Date of Patent: Apr. 30, 1991

[54] FULL WAVE RECTIFIER/AVERAGING CIRCUIT

[75] Inventors: David M. Susak, Chandler; Scott K. Bader, Mesa, both of Ariz.

[73] Assignee: Motorola Inc., Schaumburg, Ill.

[21] Appl. No.: 428,671

[22] Filed: Oct. 30, 1989

[51] Int. Cl.$^5$ .......................... G06G 7/12; H03K 5/00; H03F 3/04
[52] U.S. Cl. ...................................... 307/490; 328/26; 328/32; 328/127; 330/288; 307/261; 363/167
[58] Field of Search ...................... 328/32, 26, 17, 142, 328/127, 128, 261; 330/261, 288; 307/490, 491, 261; 363/167

[56] References Cited

U.S. PATENT DOCUMENTS

| | | | |
|---|---|---|---|
| 4,187,537 | 2/1980 | Avicola et al. | 328/26 |
| 4,305,008 | 12/1981 | Sutton | 328/26 |
| 4,333,141 | 6/1982 | Nagano | 328/26 |
| 4,360,866 | 11/1982 | Main et al. | 328/26 |
| 4,521,697 | 6/1985 | Joseph | 330/288 |
| 4,525,683 | 6/1985 | Jason | 330/288 |
| 4,575,643 | 3/1986 | Sakai | 328/26 |

Primary Examiner—Stanley D. Miller
Assistant Examiner—Yen Nguyen
Attorney, Agent, or Firm—Michael D. Bingham

[57] ABSTRACT

A full wave rectifier/averaging circuit for processing an input signal having a large dynamic range. A rectification circuit is responsive to the input signal for providing a first signal to a current mirror whereby the current mirror provides a second signal in response to the first signal. An averaging circuit is coupled to the current mirror to perform averaging of the second signal. An output circuit is coupled to the averaging circuit to provide an output signal at an output terminal.

10 Claims, 2 Drawing Sheets

FULL WAVE RECTIFIER/AVERAGING CIRCUIT

BACKGROUND OF THE INVENTION

Historically, companding is a widely used technique for gaining a signal to noise ratio improvement in systems where a signal is passed through a noisy transmission medium. Companding is utilized when one wishes to transmit a signal with a large dynamic range through a channel that has limited dynamic range. The process of companding is a method whereby data with a large dynamic range is first "compressed" thereby attenuating the high voltage signals and amplifying the low voltage signals. This compressed limited dynamic range signal is then usually transmitted over a channel. Upon receipt, the data is "expanded" thereby amplifying the high voltage signals and attenuating the low voltage signals.

The basic building blocks of a compander are an operational amplifier (op amp), a full wave rectifier/averaging circuit and a variable gain stage. The op amp is typically connected in a negative feedback mode whereby the full wave rectifier/averaging circuit and the variable gain stage are either in the feedback loop for compressor implementation or connected to the inverting input of the op amp for expander implementation.

The full wave rectifier/averaging circuit performs full wave rectification of the input signal, for the expander, or of the output signal, for the compressor, and then averages the rectified signal to obtain a voltage signal that is proportional to the average level of the input or output signal for a expander or compressor, respectively. This signal then feeds the variable gain stage which determines the overall gain of the compander.

Using a compander for applications which require large dynamic range input signals has been difficult in the past. This is because most, if not all, prior art has performed the full wave rectification by an NPN/PNP transistor combination of Q1 and Q2, as shown in FIG. 1. Error arises due to the beta error that inherently exists between NPN transistor Q1 and PNP transistor Q2, especially for high currents. Q1 and Q2 will also track differently with respect to temperature and process. Also the negative going input signal passing through Q1 is mirrored by M2 before averaging, while the positive going input signal passing through Q2 is not mirrored before averaging. This produces additional beta errors due to the mirror M2.

Another reason that prior art is difficult to use for large dynamic range input signals is due to the varying resistance of D1, shown in FIG. 1, for varying input signal levels. For large currents the resistance of diode D1 is typically much smaller than $R_A$, thereby $R_A$ dominates the RC time constant as intended. However, for small currents the resistance of diode D1 is much larger than $R_A$, thereby increasing the effective resistance from $R_A$ to $R_A+R_{D1}$. This will have an undesirable effect of increasing the RC time constant thereby increasing the time to reach a steady state voltage.

One attempt that prior art has made to maintain a constant resistance of D1 has been to pre-bias the diode D1 with a current source so that D1 is always on. However, an equivalent current source must exist at the output to cancel the pre-bias current in $I_{AVE}$. The problem with this method surfaces when the pre-bias current must be cancelled to obtain an accurate representation for very small $I_{AVE}$. This requires a current source to be accurate to nanoamperes.

In order to utilize a full wave rectifier/averaging circuit for large dynamic range input signals, the beta errors need to be minimized and the RC time constant needs to be fixed for small as well as large signals.

Hence, a need exists for an improved circuit and method for providing a full wave rectifier/averaging circuit in transmission systems.

SUMMARY OF THE INVENTION

Accordingly, it is an object of the present invention to provide an improved full wave rectifier/averaging circuit.

Another object of the present invention is to minimize beta errors that result in rectifying large signals.

Still another object of the present invention is to abate the additional beta error caused by mirroring only one half of the rectified signal.

Yet another object of the present invention is to maintain a fixed RC time constant of the average circuit for all input signal levels.

In carrying out the above and other objects of the invention, there is provided a full wave rectifier/averaging circuit for accepting input signals comprising rectification circuit for receiving the input signals and for providing a rectified signal; and a current mirror coupled to the rectification circuit for providing an output signal that is a mirror image of the rectified signal. An averaging circuit performs averaging of the output signal of the current mirror and provides an averaged signal to an output circuit which provides an output signal of the circuit that is related to the input signal.

The above and other objects, features and advantages of the present invention will be better understood from the following detailed description taken in conjunction with the accompanying drawings.

DETAILED DESCRIPTION OF THE INVENTION

Figure 2:
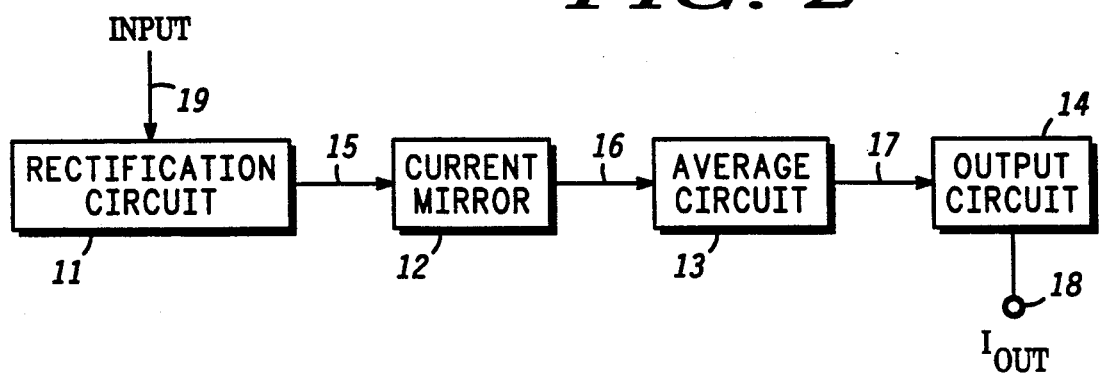
FIG. 2 is a block diagram illustrating the full wave rectifier/averaging circuit of the preferred embodiment of the present invention.

Referring to FIG. 2, a block diagram of the full wave rectifier/averaging circuit of the present invention is shown comprising rectification circuit 11 which rectifies an input signal supplied at input 19 for providing a signal at 15 to current mirror 12. Current mirror 12 will provide a signal at 16 to average circuit 13 that is averaged and then applied to output circuit 14 via 17. An output current is provided at output terminal 18 from output circuit 14.

Briefly, rectification circuit 11 provides the signal at 15 which is a full wave rectified version of the input signal which is then mirrored through the current mirror 12, where its output provides a current signal to average circuit 13. An average circuit 13, comprising an RC network, performs averaging of the signal at 16 and provides a signal at 17 to output circuit 14 which will provide an output at the output terminal 18. The operation will be explained further with the more detailed embodiments described hereinafter.

Figure 3:
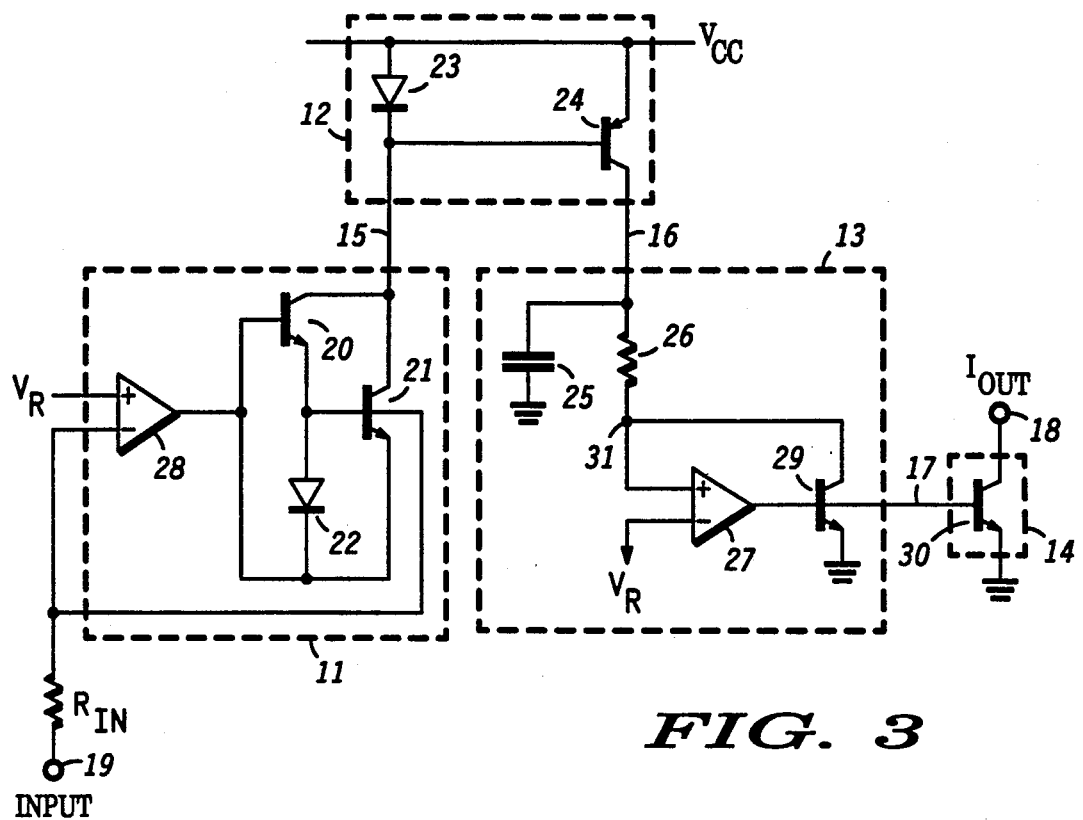
FIG. 3 is a schematic diagram illustrating a first embodiment of FIG. 2.

Referring to FIG. 3, there is illustrated a detailed schematic of one embodiment of FIG. 2. Rectification circuit 11 is shown as including op amp 28 configured in a negative feedback mode having a non-inverting input coupled to a reference voltage, $V_R$, an inverting input coupled to input 19 via $R_{IN}$ at which the input is applied, to the emitter of transistor 20, to the base of transistor 21, and to the anode of diode 22. The output of op amp 28 is coupled to the base of transistor 20, to the emitter of transistor 21 and to the cathode of diode 22 respectively. Diode 22 may be formed by a transistor having its base and collector shorted together as is understood. The collector of transistor 20 is coupled to the collector of transistor 21 and the input of current mirror 12 at 15. Current mirror 12, as known, is comprised of diode 23, the anode of which is coupled to a first power supply conductor at which the operating potential $V_{CC}$ is applied while the cathode is coupled to the input thereof. Diode 23 which may be similarly formed from a collector-base shorted PNP transistor, is coupled across the emitter-base of transistor 24 the collector of which is coupled to the output of current mirror 12 at 16.

Average circuit 13 includes an RC filter comprising capacitor 25 coupled between the output of current mirror 12 and a second power supply conductor at which ground reference is supplied and resistor 26, one end of which is coupled to 16. The other end of resistor 26 is coupled to node 31, to the non-inverting input of op amp 27 and to the collector of transistor 29. The inverting input of op amp 27 is coupled to a reference voltage, $V_R$, while the output thereof is coupled to the base of transistor 29, the emitter of which is returned to ground reference. The output of average circuit 13 is taken at 17, the output of the op amp 27 and the base of transistor 29, and is coupled to the output circuit 14 at the base of transistor 30, the collector-emitter of which is coupled between output terminal 18 and ground reference.

In operation, an input signal of magnitude less than the reference signal $V_R$ will force op amp 28 to source current through transistor 20, while an input signal of magnitude greater than the reference signal will force the op amp to sink current through diode 22 which is mirrored through transistor 21 thereby producing full wave rectification. For either case, only one of the two transistors 20 or 21 will be on and the collector current of either transistor 20 or transistor 21 is sourced through diode 23. Hence, a full wave rectified version of the input signal appears at 15, at the output of the rectification circuit 11. Since the rectification is accomplished without the use of a PNP transistor, the inherent beta error of the prior art that resulted from using an NPN transistor with a PNP transistor, is alleviated.

Transistor 24 will mirror the rectified signal at 15 through its collector to provide a signal at 16 to the average circuit 13. Note also that both halves of the rectified signal are mirrored through current mirror 12 which abates the additional beta error suffered by the prior art. The averaging of signal at 16 is accomplished by resistor 26 and capacitor 25. The RC time constant will remain fixed for all levels of signals appearing at 16 since the resistance seen looking away from the resistor 26 at node 31 is very small whereby it is effectively the emitter resistance of transistor 29 divided by the gain of op amp 27. Thus, the time constant of average circuit 13 will remain constant for a wide variation of input signals. Furthermore, the output of op amp 27 will provide a voltage at the base of transistor 29 to maintain the level of the averaged signal as it flows through the transistor 29. Finally, the output transistor 30 comprises a current mirror in relation to transistor 29 whereby the current through the collector of transistor 29 is mirrored through the collector of transistor 30 to provide a signal $I_{OUT}$ at output terminal 18.

Figure 1:
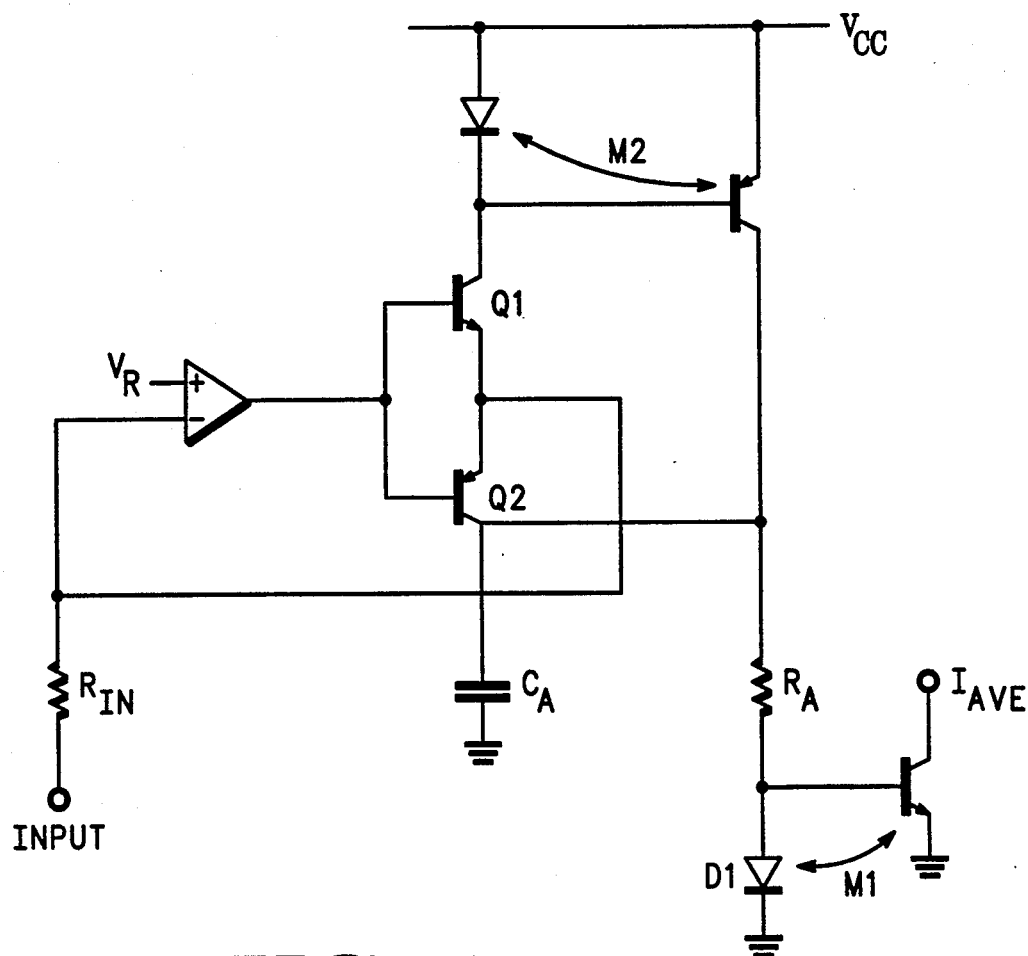
FIG. 1 is a schematic diagram illustrating a prior art full wave rectifier/averaging circuit.
Figure 4:
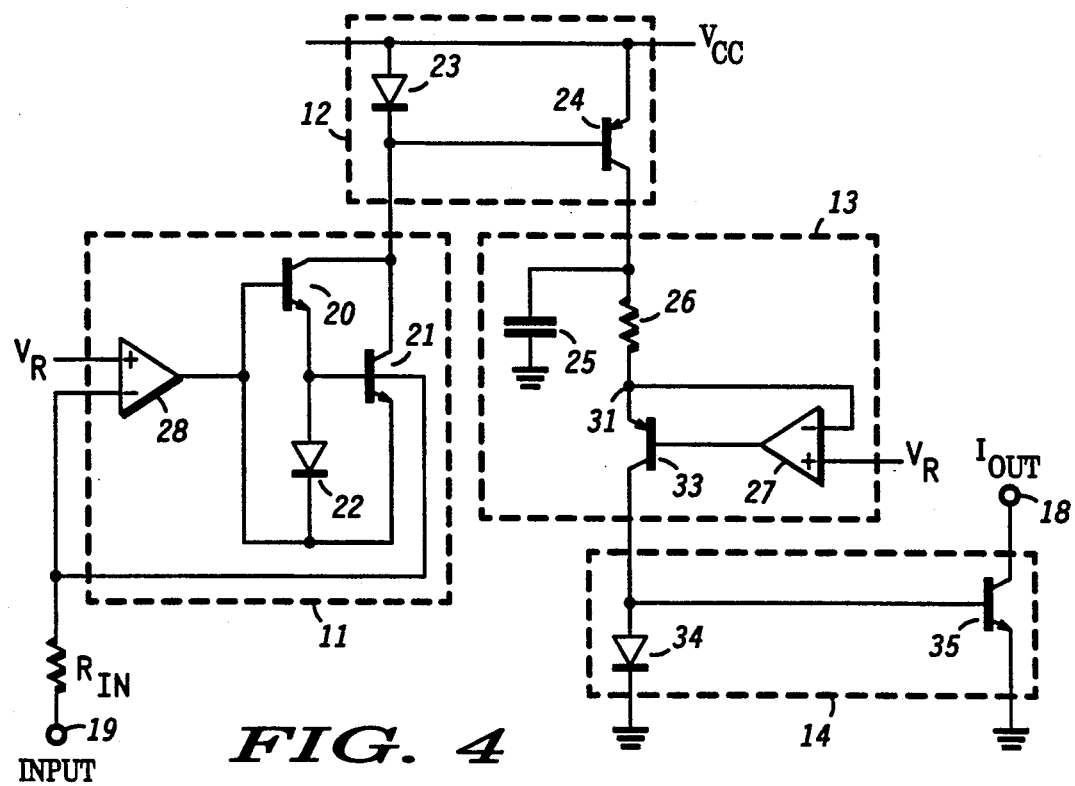
FIG. 4 is a schematic diagram illustrating a second embodiment of FIG. 2.

Referring to FIG. 4, another embodiment of FIG. 1, the components that are similar to those of FIG. 3 have been designated by the same reference numerals. In the full wave rectifier/averaging circuit of FIG. 4, transistor 29, as shown in FIG. 3, has been replaced by transistor 33 having an emitter coupled to node 31 and its base coupled to the output of op amp 27. The collector of transistor 33 is coupled to the input of the output circuit 14. In this embodiment, output circuit 14 is comprised of an additional current mirror formed by diode 34 and transistor 35, whereby its input is coupled to the input of the output circuit, its output is the output of the circuit, and the common terminal is returned to ground reference.

This circuit embodiment performs rectification in exactly the same manner and configuration as the circuit in FIG. 3. In addition, this circuit maintains a fixed time constant for average circuit 13 in a similar manner as the embodiment shown in FIG. 3 wherein the circuit configuration is slightly different as described above. As before, the resistance seen looking away from resistor 26 at node 31 is the emitter resistance of transistor 33 divided by the gain of op amp 27. Since this resistance is quite small this configuration also allows the RC time constant of average circuit 13 to remain fixed for a wide variation of input signal levels. Furthermore, the output of op amp 27 will provide a voltage to the base of transistor 33 to maintain the level of the averaged signal as it flows through transistor 33. Finally, the current through the collector of transistor 33 and diode 34 is mirrored through the collector of transistor 35 to provide the signal $I_{OUT}$ at output terminal 18.

By now it should be appreciated that there has been provided a novel circuit that successfully performs full wave rectification and averaging for a large dynamic range of input signals with minimum error and distortion.

What is claimed is:

1. A circuit for providing rectification and average of an applied input signal comprising:

rectification means responsive to the input signal for providing a first signal at an output, said first signal being a full wave rectified version of the input signal;

a current mirror having an input coupled to said rectification means for providing a second signal at an output in response to said first signal;

an operational amplifier having an inverting terminal coupled to a first reference voltage, a non-inverting terminal, and an output terminal;

a transistor having a collector coupled to said non-inverting terminal of said operational amplifier, a base coupled to said output terminal of said operational amplifier, and an emitter coupled to a supply voltage terminal;

resistor coupled between said output of said current mirror and said non-inverting terminal of said operational amplifier;

capacitive means coupled between said output of said current mirror and said first supply voltage terminal wherein said operational amplifier, said transistor, said resistive means and said capacitive means comprise an averaging circuit; and output means coupled to said output terminal of said operational amplifier for providing an output signal at an output terminal of the circuit.

2. The circuit according to claim 1 wherein said rectification means includes:

an operational amplifier having a non-inverting terminal coupled to a second reference voltage, an inverting terminal coupled to the input of the circuit, and an output terminal;

a first transistor having a collector coupled to said input of said current mirror, a base coupled to said output terminal of said operational amplifier of said rectification means, and an emitter coupled to said inverting terminal of said operational amplifier of said rectification means;

a second transistor having a collector coupled to said collector of said first transistor of said rectification means, a base coupled to said emitter of said first transistor of said rectification means, and an emitter coupled to said output terminal of said operational amplifier of said rectification means; and diode means coupled between said base and emitter of said second transistor of said rectification means.

3. The circuit according to claim 1 wherein said output means includes:

a transistor having a collector coupled to said output terminal of the circuit, a base coupled to the output terminal of said operational amplifier of said averaging means, and an emitter coupled to said supply voltage terminal.

4. A circuit for providing rectification and averaging of an applied input signal comprising:

rectification means responsive to the input signal for providing a first signal at an output, said first signal being a full wave rectified version of the input signal;

a current mirror having an input coupled to said rectification means for providing a second signal at an output in response to said first signal;

an operational amplifier having an non-inverting terminal coupled to a first reference voltage, an inverting terminal, and an output terminal;

a transistor having an emitter coupled to said inverting terminal of said operational amplifier, a base coupled to said output terminal of said operational amplifier, and a collector;

resistive means coupled between output of said current mirror and said inverting terminal of said operational amplifier;

capacitive means coupled between said output of said current mirror and a supply voltage terminal wherein said operational amplifier, said transistor, said resistive means and said capacitive means comprise an averaging circuit; and output means coupled to said collector of said transistor for providing an output signal at an output terminal of the circuit.

5. The circuit according to claim 4 wherein said rectification means includes:

an operational amplifier having a non-inverting terminal coupled to a second reference voltage, an inverting terminal coupled to the input of the circuit, and an output terminal;

a first transistor having a collector coupled to said input of said current mirror, a base coupled to said output terminal of said operational amplifier of said rectification means, and an emitter coupled to said inverting terminal of said operational amplifier of said rectification means;

a second transistor having a collector coupled to said collector of said first transistor of said rectification means, a base coupled to said emitter of said first transistor of said rectification means, and an emitter coupled to said output terminal of said operational amplifier of said rectification means; and diode means coupled between said base and emitter of said second transistor of said rectification means.

6. The circuit according to claim 4 wherein said output means includes:

a current mirror having an input coupled to the collector of said transistor of said averaging means an output coupled to said output terminal of the circuit, and a common terminal coupled to said supply voltage terminal.

7. The circuit according to claim 6 wherein said current mirror of said output means includes:

a transistor having a collector coupled to said output of said current mirror of said output means, a base coupled to said input of said current mirror of said output means, and an emitter coupled to said common terminal of said current mirror of said output means; and diode means coupled between the base and emitter of said transistor of said current mirror of said output means.

8. An improved full wave rectifier/averaging circuit including rectification means for providing a first signal to an input of a current mirror and for providing a second signal at an output in response to said first signal, averaging means for averaging said second signal and an output means responsive to said averaging means for providing an output signal, wherein the improvement comprises said rectification means including:

an operational amplifier having a non-inverting terminal coupled to a reference voltage, an inverting terminal coupled to an input of the circuit, and an output terminal; and a first transistor having a collector coupled to said input of said current mirror, a base coupled to said output terminal of said operational amplifier, and an emitter coupled to said inverting terminal of said operational amplifier;

a second transistor having a collector coupled to said collector of said first transistor, a base coupled to said emitter of said first transistor, and an emitter coupled to said output terminal of said operational amplifier; and diode means coupled between said base and emitter of said second transistor.

9. The circuit according to claim 8 wherein the improvement further includes said averaging means comprising:

resistive means;

capacitive means coupled between the output of the current mirror and a first supply voltage terminal;

an operational amplifier having an inverting terminal coupled to a reference voltage, a non-inverting terminal coupled said output of said current mirror by said resistive means, and an output terminal; and a transistor having a collector coupled to said non-inverting terminal of said operational amplifier of said averaging means, a base coupled to said output terminal of said operational amplifier of said averaging means and to said output means, and an emitter coupled to said supply voltage terminal 10. The circuit according to claim 8 wherein the improvement further includes said averaging means comprising:

resistive means;

capacitive means coupled between said output of said current mirror and a supply voltage terminal;

an operational amplifier having a non-inverting terminal coupled to a reference voltage, an inverting terminal coupled to said output of said current mirror by said resistive means, and an output terminal; and a transistor having a collector coupled to said output means, a base coupled to said output terminal of said operational amplifier of said averaging means, and an emitter coupled to said inverting terminal of said operational amplifier of said averaging means.

* * * * *